United States Patent [19]

Quillen

[11] Patent Number: 4,869,198
[45] Date of Patent: Sep. 26, 1989

[54] VACUUM DEBUBBLER MACHINE
[75] Inventor: Paul Quillen, Warsaw, Ind.
[73] Assignee: Union Tool Corporation, Warsaw, Ind.
[21] Appl. No.: 252,426
[22] Filed: Sep. 30, 1988
[51] Int. Cl.[4] .............................................. B05C 3/09
[52] U.S. Cl. ...................... 118/50; 118/600; 118/671; 427/350
[58] Field of Search ............. 118/50, 671, 600; 427/350 X, 398.4

[56] References Cited

U.S. PATENT DOCUMENTS

| | | | |
|---|---|---|---|
| 4,144,836 | 3/1979 | Bernath | 118/50 |
| 4,385,083 | 5/1983 | Shelley | 118/50 |
| 4,418,639 | 12/1983 | Wills et al. | 118/50 |
| 4,676,884 | 6/1987 | Dimock et al. | 118/50 |
| 4,693,777 | 9/1987 | Hazano et al. | 118/50 |
| 4,715,319 | 12/1987 | Bringmann et al. | 118/50.1 |
| 4,791,880 | 12/1988 | Aigo | 118/50 |

FOREIGN PATENT DOCUMENTS 0116372 7/1984 Japan ...................................... 118/50

OTHER PUBLICATIONS

Boudah et al., "Wafer Sensing Bernoulli Head", IBM Tech. Disc. Bul., (vol. 18, No. 8, Jan. 1976).

Primary Examiner—Willard Hoag
Attorney, Agent, or Firm—James D. Hall; Thomas J. Dodd; Todd A. Dawson

[57] ABSTRACT

A machine for removing bubbles from coated flat substrates, namely PC boards. The machine includes one or more conveyors for transporting the boards into an enclosure and a vacuum platen positioned above the conveyor which, when lowered into contact with the conveyor encloses the board in a plenum. A pump withdraws air from the plenum to create a vacuum and remove any entrained or surface bubbles from the boards.

10 Claims, 6 Drawing Sheets

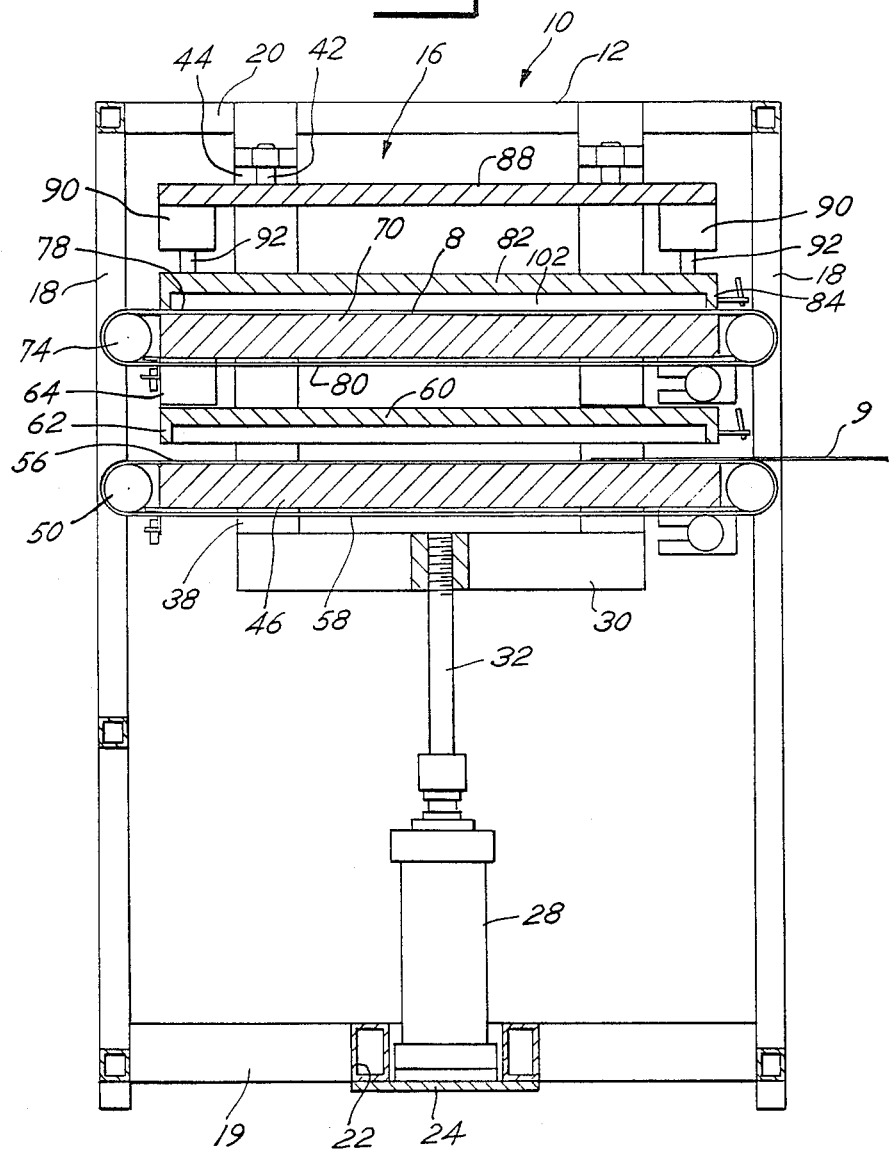

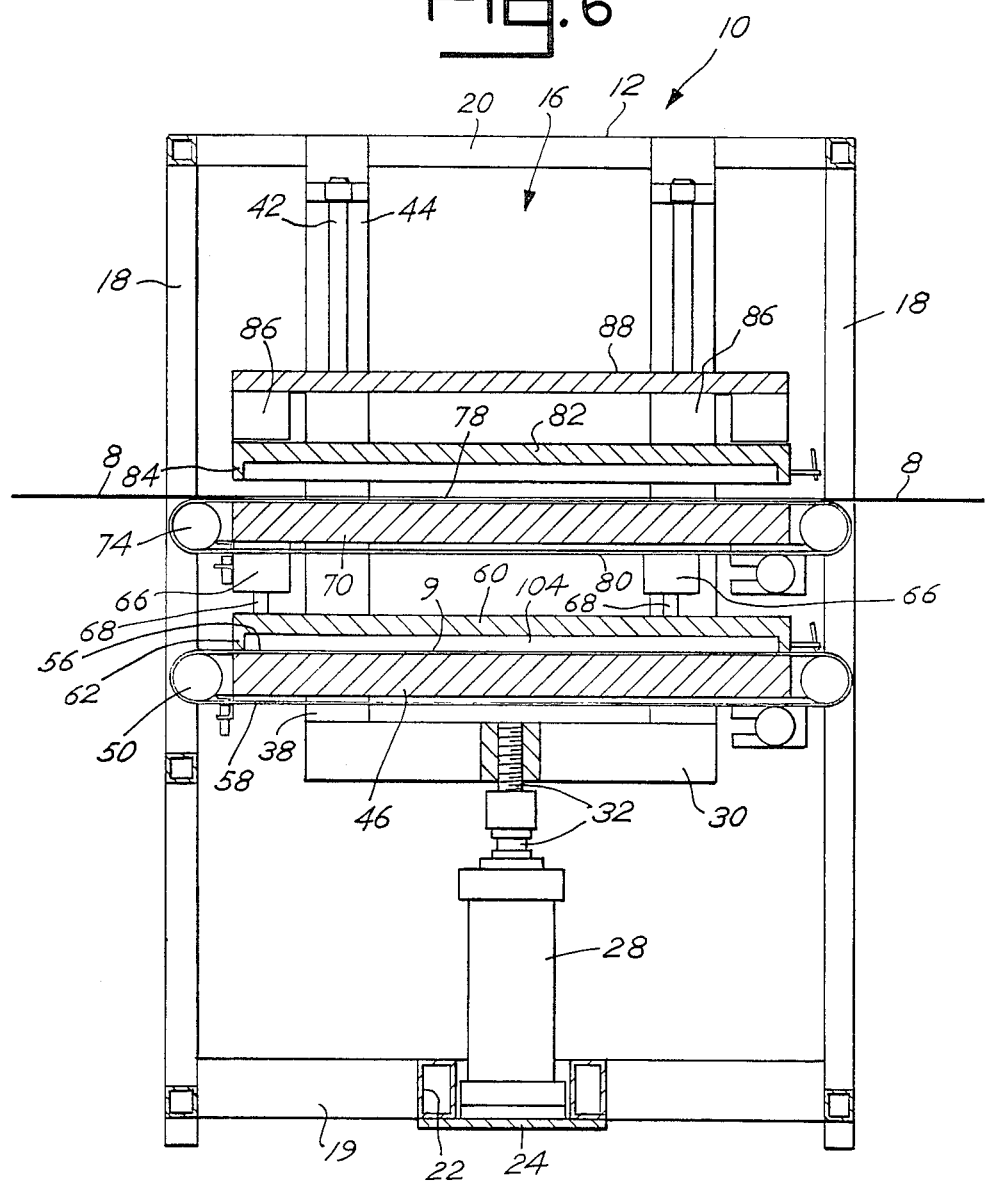

VACUUM DEBUBBLER MACHINE

SUMMARY OF THE INVENTION

This invention relates to a debubbling machine and will have special application to a debubbler which utilizes vacuum technology in removing bubbles from a PC board which has been coated with a liquid.

Printed circuit (PC) boards are normally coated with a liquid mask prior to implementation. These liquid masks are usually applied by screen printing roller coating or curtain coating and are important to the usability of the board. One of the major problems with applying liquid masks to PC boards is that they often leave air bubbles in the mark, which, if left untreated could interfere with the fine line board circuitry.

Previous methods in removing these bubbles from the PC boards involved physical removal of the coated boards or substrates from the board processing line and placing them on horizontal racks whereby the bubbles eventually come to the surface and dissipate. This procedure can add up to sixty minutes to the PC board processing time.

The machine of this invention removes the bubbles from coated substrates by subjecting the substrates to a vacuum created by a platen which contacts a supported conveyor then drawing air out of the formed vacuum chamber. The vacuum causes the bubbles to rapidly rise to the surface of the coated substrate where they burst and the residual air is then pulled out of the chamber by the vacuum pump. A macine which includes two or more conveyors and platens may be utilized to provide a continuous and faster process for eliminating substrate air bubbles.

Accordingly, it is an object of this invention to provide for a machine which eliminates bubbles from a coated substrate.

Another object is to provide for a debubbler which utilizes a vacuum to eliminate substrate bubbles.

Another object is to provide for a continuous operation debubbler which can be incorporated directly into the PC board processing line.

Still another object is to provide for a debubbling machine which decreases PC board production time and increases efficiency in removing entrapped air bubbles.

Other objects of this invention will become apparent upon a reading of the following description.

BRIEF DESCRIPTION OF THE DRAWINGS

A preferred embodiment of the invention has been depicted for illustrative purposes only wherein:

FIG. 5 is a sectional view taken along line 5—5 of FIG. 2.

FIG. 6 is a sectional view taken along line 6—6 of FIG. 3.

DESCRIPTION OF THE PREFERRED EMBODIMENT

Figure 1:
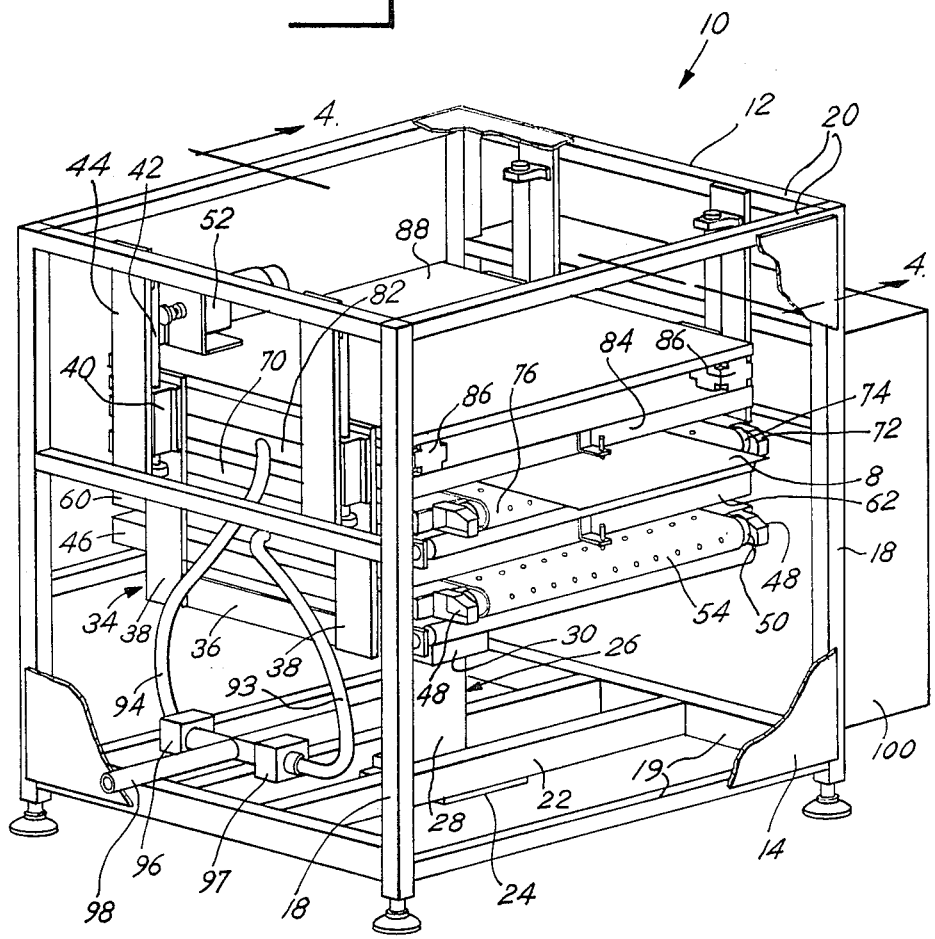
FIG. 1 is a perspective view of the debubbling machine with the conveyors and platens in the first board loading position.
Figure 2:
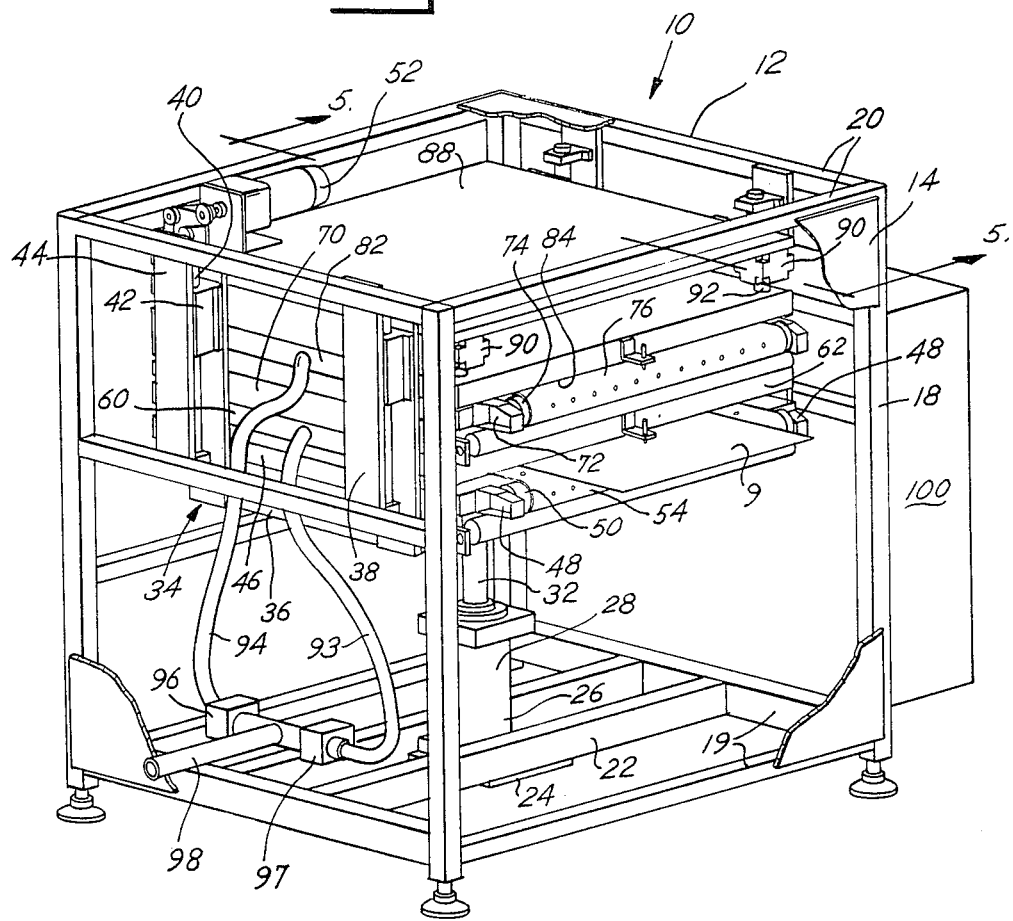
FIG. 2 is a perspective view of the machine showing the upper conveyor and a platen in a debubbling position and the lower conveyor and platen in a loading position.
Figure 3:
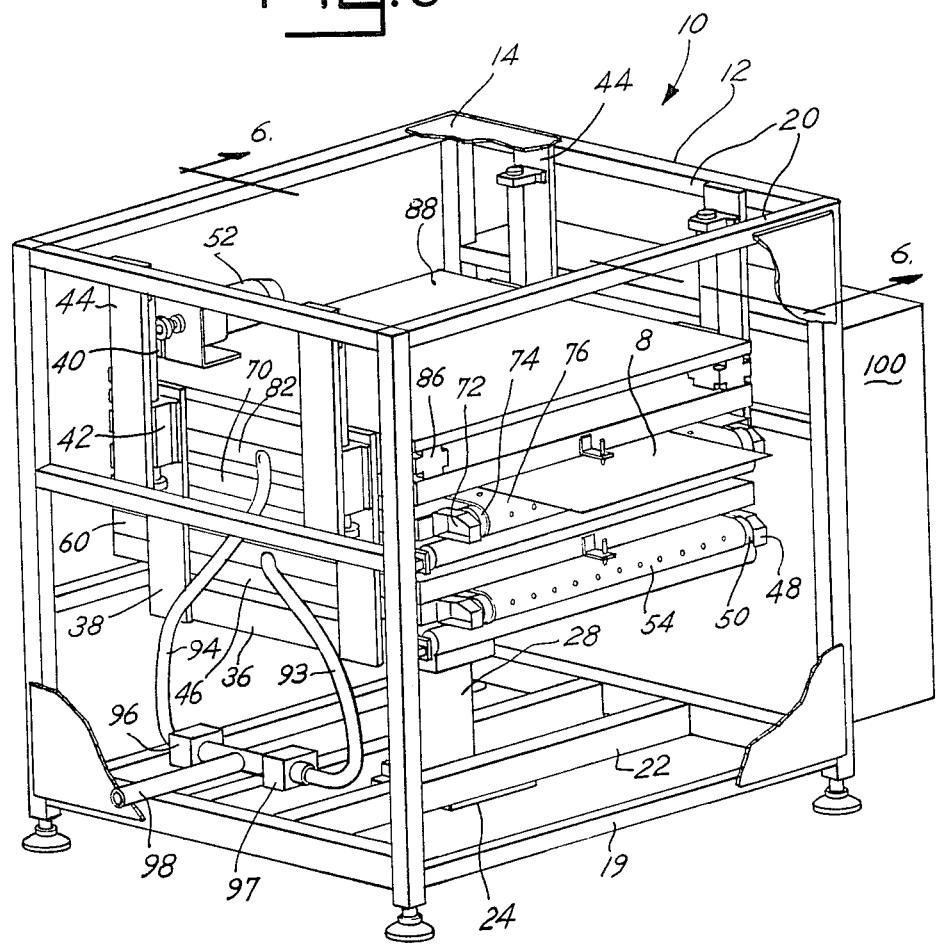
FIG. 3 is a view similar to FIG. 1 showing the lower conveyor and platen in a debubbling position.

The preferred embodiment herein described is not intended to be exhaustive or to limit the invention to the precise form disclosed. It is chosen and described to explain the principles of the invention and its application and practical use to enable others skilled in the art to utilize the invention.

As shown in the drawings debubbling machine 10 includes a peripheral support frame 12 and an outer cover 14 (shown cut away in the drawings) which define an inner chamber 16. Frame 12 includes interconnecting vertical frame members 18 and horizontal frame members 19, 20.

Cross members 22 extend between lower horizontal frame members 19 and with plate 24 support a lifting cylinder 26 which may be of the pneumatic or hydraulic variety. Cylinder 26 includes a block 28 and extendable rod 32 which is connected at its distal end to lower support 30. Support 30 is connected to an inner frame 34 which includes horizontal frame member 36 and vertical frame members 38. Vertical frame members 38 include outer guide blocks 40 through which extend guide rods 42 as shown to provide for straight up and down movement of inner frame 34 correlative with cylinder rod 32. Guide rods 42 are connected to machine frame 12 through vertical studs 44.

Inner frame 34 carries and supports the operational parts of machine 10. It is understood that, while two support platens, two vacuum platens and two conveyors are depicted, the process of bubble removal from a flat substrate, such as PC board 8, is the same regardless of the number of platens and conveyors.

A lower support platen 46 is connected between vertical frame members 38 and includes opposite extending roller guides 48. A roller 50 is journalled in each pair of guides 48 and one or both of the rollers are turned by a conventional electric motor 52 which is operatively connected to one or both rollers 50. An endless conveyor belt 54 formed of conventional fabric or synthetic material is stretched across rollers 50 so that correlative rotation of the rollers 50 and belt 54 is achieved. Belt 54 defines upper run 56 and lower run 58.

A vacuum plate 60 is positioned between vertical frame members 38 above conveyor belt 54. Platen 60 includes a downturned continuous peripheral flange 62. Lowering power cylinders 64 (two shown) are connected between platen 60 and upper support plate 70. Power cylinders 64 each include block 66 connected to plate 70 and an extendable rod 68 connected to platen 60 as shown in FIG. 6.

Upper support platen 70 is connected between vertical frame members 38 and includes roller guides 72 similar to roller guides 48. Rollers 74 are journalled in guides 72 and driven by motor 52 in the same fashion as rollers 50. It should be noted that motor 52 will be connected to rollers 50 and 74 in a fashion such that each set of rollers may be driven independently of the other. This split type of connection is known to those skilled in the art and does not form a part of this invention. An endless conveyor belt 76 is stretched across rollers 74 to achieve correlative rotation of the belt and rollers. Belt 76 defines lower run 80 and upper run 78 and is of a width sufficient to accommodate PC board 8, but narrow enough to allow connection of cylinder blocks 66 to platen 70.

Vacuum plate 82 is positioned between vertical frame members 38 above belt 76 and includes a downturned continuous peripheral flange 84. Lowering power cylinders 86 are connected between upper support plate 88 and vacuum platen 82. Power cylinders 86 include block 90 connected to plate 88 and extendable rod 92 connected to platen 82. Plate 88 is connected to and between vertical frame members 38.

A vacuum pump (not shown) is connected operatively between vacuum platens 60, 82 through tubing 93, 94. Automatic valves 96, 97 control air flow towards main vacuum tube 98. An electronics cabinet 100 houses a programmable control (not shown) of conventional construction which correlates the cycling of all of the moving parts of machine 10.

Figure 4:
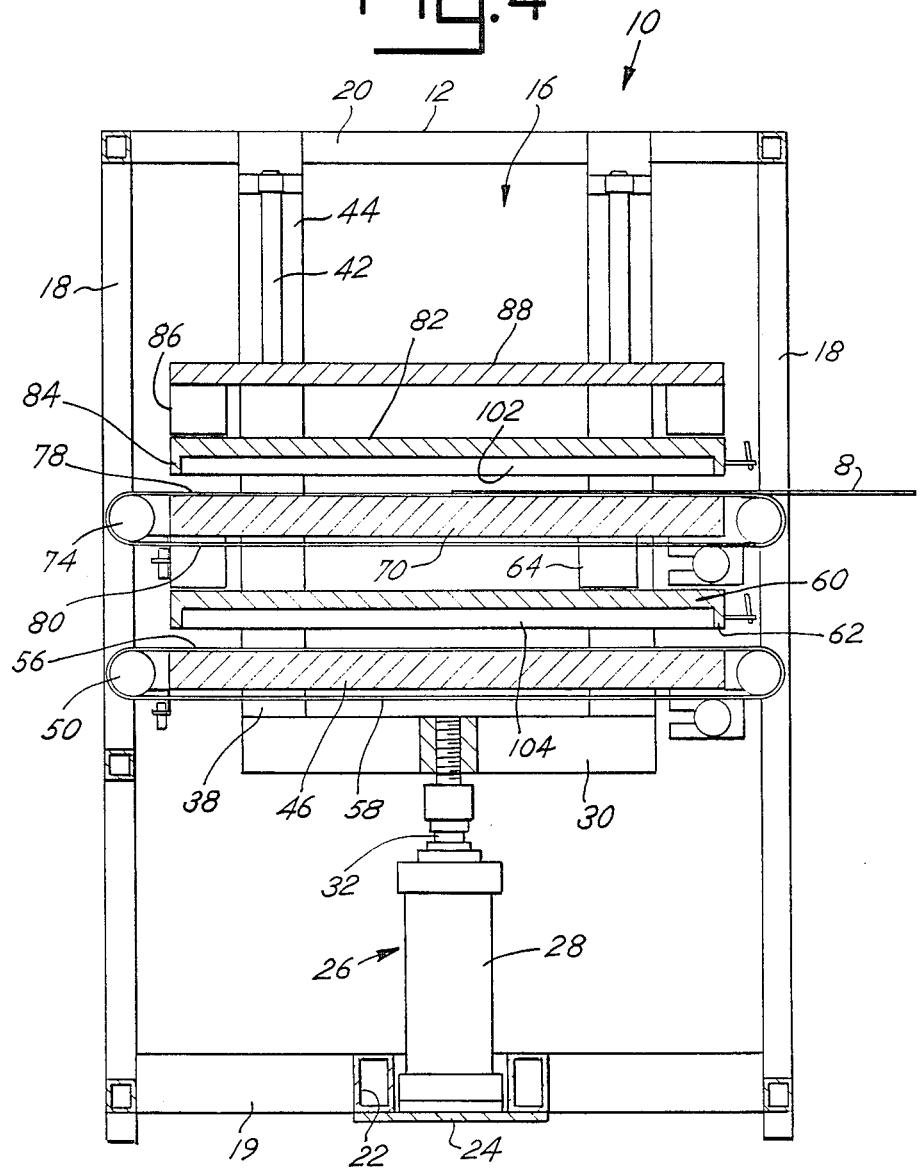
FIG. 4 is a sectional view taken along line 4—4 of FIG. 1.

Machine 10 operates to remove bubbles from PC board 8 as follows. As board 8 completes the coating cycle (not shown), it is transported towards machine 10 by conveyor belts (not shown) and enters machine 10 through a slot in cover 14 known in the trade as the material pass line. Conveyor upper run 78 is aligned with the pass line so that board 8 slides onto belt 76 as seen in FIG. 4. The programmable control (not shown) then signals motor 52 to turn rollers 74 and belt 76 until the PC board 8 is completely within enclosure 16 beneath vacuum platen 82. Motor 52 then stops and lifting cylinder 26 is activated along with lowering power cylinders 86. Rod 32 lifts inner frame 34 until lower conveyor belt upper run 56 is aligned with the pass line (FIG. 5) and a second PC board 9 slides onto belt 54 which is rotating with its rollers 50. At this time, power cylinder rods 92 extend to urge flange 84 of vacuum plates 82 into contact with upper belt upper run 78 and platen 70 to form a plenum 102. Vacuum pump (not shown) and valve 96 are then activated to draw air from plenum 102 for a predetermined time (usually a few seconds) to remove any bubbles from the coated PC board 8.

After the second PC board 9 is placed beneath vacuum platen 60, belt 54 stops. When bubble removal from board 8 is completed, or when the predetermined time elapses, cylinder rods 92 retracted and lifting cylinder rod 32 retracts into block 28 to lower inner frame 34. When upper belt upper run 78 is again aligned with the pass line, motor 52 drives rollers 74 and belt 76 to cause board 8 to exit machine 10 where it may be transported to the next processing station (not shown). Another board 8 may now enter machine 10 onto belt 76. At this time, cylinder rods 68 extend to urge flange 62 of vacuum platen 60 into contact with lower belt upper run 56 and platen 46 to form a plenum 104. Vacuum pump (not shown) and valve 97 are activated to draw air from plenum 104 as described above for plenum 102. This completes one full cycle of machine 10 which may continuously recycle under the influence of the programmable controller.

It is understood that the above description does not limit the invention to the precise details above-given, but may be modified within the scope of the appended claims.

I claim:

1. A machine for removing bubbles from coated flat substrates, said machine comprising a frame defining an enclosure, conveyor means having upper and lower runs carried by said frame for transporting a flat substrate into said enclosure, a platen positioned adjacent said conveyor means, said platen including a downturned continuous peripheral flange, means for shifting said platen towards said conveyor means wherein said peripheral flange contacts said conveyor means upper run and forms a vacuum chamber containing said flat substrate, and means connected to one of said platen and conveyor means for drawing air from within said vacuum chamber to remove any bubbles present on said flat substrate.

2. The machine of claim 1 wherein said conveyor means includes an endless conveyor belt journalled about end rollers with the upper and lower runs separated by a separator platen, and said means for shifting includes a pneumatic cylinder connected to said platen.

3. The machine of claim 1 and a programmable control means for signalling said conveyor means to stop when said flat substrate is beneath said platen in said enclosure, said programmable control means for further signalling said means for shifting to shift the platen into contact with said conveyor means to form said vacuum chamber with the flat substrate inside the vacuum chamber, said programmable control means for further activating said means for drawing.

4. The machine of claim 2 and a second conveyor means having upper and lower runs spaced from said first mentioned conveyor means for transporting a second flat substrate into said enclosure, a second platen including a downturned continuous peripheral flange spaced from said second conveyor means, said means for shifting also connected operatively to said second platen to shift said second platen into contact with said second conveyor means upper run to form a second vacuum chamber, said drawing means also connected to one of said second platen and conveyor means to draw air from said second vacuum chamber.

5. The machine of claim 4 wherein said second conveyor means is an endless conveyor belt journalled about rollers and said pneumatic cylinder is connected operatively to said second platen.

6. A machine for removing bubbles from coated flat substrates which comprises:
   a frame which defines an enclosure; first conveyor means for transporting flat substrate into said enclosure including upper and lower runs journalled about driving rollers located in said enclosure spaced from said first conveyor means;
   a flat platen positioned in said enclosure above said first conveyor means, said first platen having a continuous peripheral flange extending toward said first conveyor means; a second platen positioned in said enclosure below said first conveyor means lower run and said second conveyor means, said second platen having a continuous peripheral flange extending towards said second conveyor means;
   means for shifting said first platen with respect to said first conveyor means when said flat substrate is present on said first conveyor means upper run wherein a first vacuum chamber is formed about the flat substrate;
   means for shifting said second platen with respect to said second conveyor means when said second flat substrate is present on said second conveyor means upper run to form a second vacuum chamber about the second flat substrate;
   means for drawing air from said first and second vacuum chamber to remove bubbles from said flat substrate; and means for interconnecting said first and second platens and conveyor means for correlative movement within said enclosure.

7. The machine of claim 6 wherein said interconnecting means includes an inner frame connected to a lifting cylinder, said lifting cylinder constituting means for elevating said inner frame wherein a single entry part for said flat substrates into said enclosure may be utilized.

8. The machine of claim 7 wherein said means for shifting said first platen includes first power cylinder having an extendable rod connected to the first platen, and said means for shifting said second platen includes a second power cylinder connected to the second platen, said machine further including programmable means for selectively actuating one of said first and second power cylinders to extend its said rod and its respective connected platen into contact with the respective conveyor means upper run.

9. The machine of claim 9 wherein said lifting cylinder being actuatable by said programmable control means to shift said inner frame independently of said first and second power cylinders.

10. The machine of claim 7 wherein said first and second conveyor means include endless conveyor belts with the upper and lower runs separated by a separator platen connected to one of said machine frame and inner frame.

* * * * *